(12) United States Patent
Meharry (10) Patent No.: US 7,592,866 B2
(45) Date of Patent: Sep. 22, 2009

(54) WIDEBRAND DIFFERENTIAL AMPLIFIER INCLUDING SINGLE-ENDED AMPLIFIERS COUPLED TO A FOUR-PORT TRANSFORMER

(75) Inventor: David E. Meharry, Lexington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 108 days.

(21) Appl. No.: 11/708,992

(22) Filed: Feb. 20, 2007

(65) Prior Publication Data

US 2008/0218263 A1     Sep. 11, 2008

Related U.S. Application Data

(60) Provisional application No. 60/774,582, filed on Feb. 17, 2006.

(51) Int. Cl.
*H03F 1/00* (2006.01)

(52) U.S. Cl. .................. 330/195; 330/165; 330/301
(58) Field of Classification Search ............. 330/195, 330/165, 301
See application file for complete search history.

(56) References Cited

U.S. PATENT DOCUMENTS

| | | | | |
|---|---|---|---|---|
| 4,606,046 A | * | 8/1986 | Ludwick | 375/286 |
| 4,703,283 A | * | 10/1987 | Samuels | 330/9 |
| 5,822,426 A | * | 10/1998 | Rasmus et al. | 379/402 |
| 6,545,542 B2 | * | 4/2003 | Matsuyoshi et al. | 330/301 |
| 2008/0007335 A1 | * | 1/2008 | Park et al. | 330/195 |

* cited by examiner

*Primary Examiner*—Patricia Nguyen
(74) *Attorney, Agent, or Firm*—Graybeal Jackson LLP; Paul F. Rusyn; Daniel J. Long (57) ABSTRACT

A differential amplifier is formed from a first single-ended amplifier circuit, a second single-ended amplifier circuit, and a four-port transformer circuit coupled to the first and second single-ended amplifier circuits to form the differential amplifier.

20 Claims, 6 Drawing Sheets

WIDEBRAND DIFFERENTIAL AMPLIFIER INCLUDING SINGLE-ENDED AMPLIFIERS COUPLED TO A FOUR-PORT TRANSFORMER

PRIORITY CLAIM

This application claims priority to U.S. Provisional Application Ser. No. 60/774,582 filed on Feb. 17, 2006, which is incorporated by reference.

TECHNICAL FIELD

Embodiments of the present invention relate generally to amplifying circuits and more specifically to wideband differential amplifier circuits.

BACKGROUND OF THE INVENTION

Differential amplifiers are utilized in a myriad of different applications in electronic circuits. At lower frequencies, the topology of conventional differential amplifiers typically takes the form of the so called "long-tailed pair" topology. With this topology, two input transistors each receive a respective input signal and the transistors have their source or emitter terminals interconnected and connected to a constant current source. This topology may not be suitable at higher frequencies due to instability of the amplifier and also due to a poor common mode rejection ratio (CMRR). A poor CMRR results in the amplifier being unable to adequately suppress spurious signals present on both the input signal supplied to the input transistors. Moreover, at centimeter and millimeter wavelengths, wideband or broadband differential amplifiers having relatively constant gain for input signals over a wide range of frequencies are typically difficult to design using the long-tailed pair topology.

Intermodulation distortion results from two input signals of different frequencies being mixed together due to nonlinearities in the transfer characteristics of a device receiving these two signals. High frequency amplifiers in multiple carrier broadband systems are such devices, for example. This mixing or intermodulation distortion of the two signals forms additional signals at frequencies that are not at harmonic frequencies (integer multiples) of either of the frequencies of the input signals, as well as at the harmonics. The largest intermodulation products appear at f1+f2, f1−f2, 2f1, and 2f2 and are referred to as second-order intermodulation while a third-order intermodulation occurs at 2f1−f2 or 2f2−f1 and has a lower power output power, as will be appreciated by those skilled in the art. Likewise, second and third order intermodulation are special cases of even and odd order nonlinearities respectively.

A differential amplifier with good common mode rejection should suppress the even order intermodulation distortion signals. If the differential amplifier has poor common mode rejection, however, then these signals may not be adequately suppressed and may accordingly be present at the output of the differential amplifier. In some applications where the bandwidth of the differential amplifier circuit is narrow these unwanted intermodulation distortion signals will be filtered out. In wideband differential amplifiers, however, the intermodulation distortion signals are not filtered out and must be suppressed in another way.

There is a need for an improved differential amplifier circuit topology.

SUMMARY OF THE INVENTION

According to one embodiment of the present invention, a differential amplifier includes a first single-ended amplifier circuit, a second single-ended amplifier circuit, and a four-port transformer circuit coupled to the first and second single-ended amplifier circuits to form the differential amplifier.

DETAILED DESCRIPTION OF PREFERRED EMBODIMENTS

Figure 1:
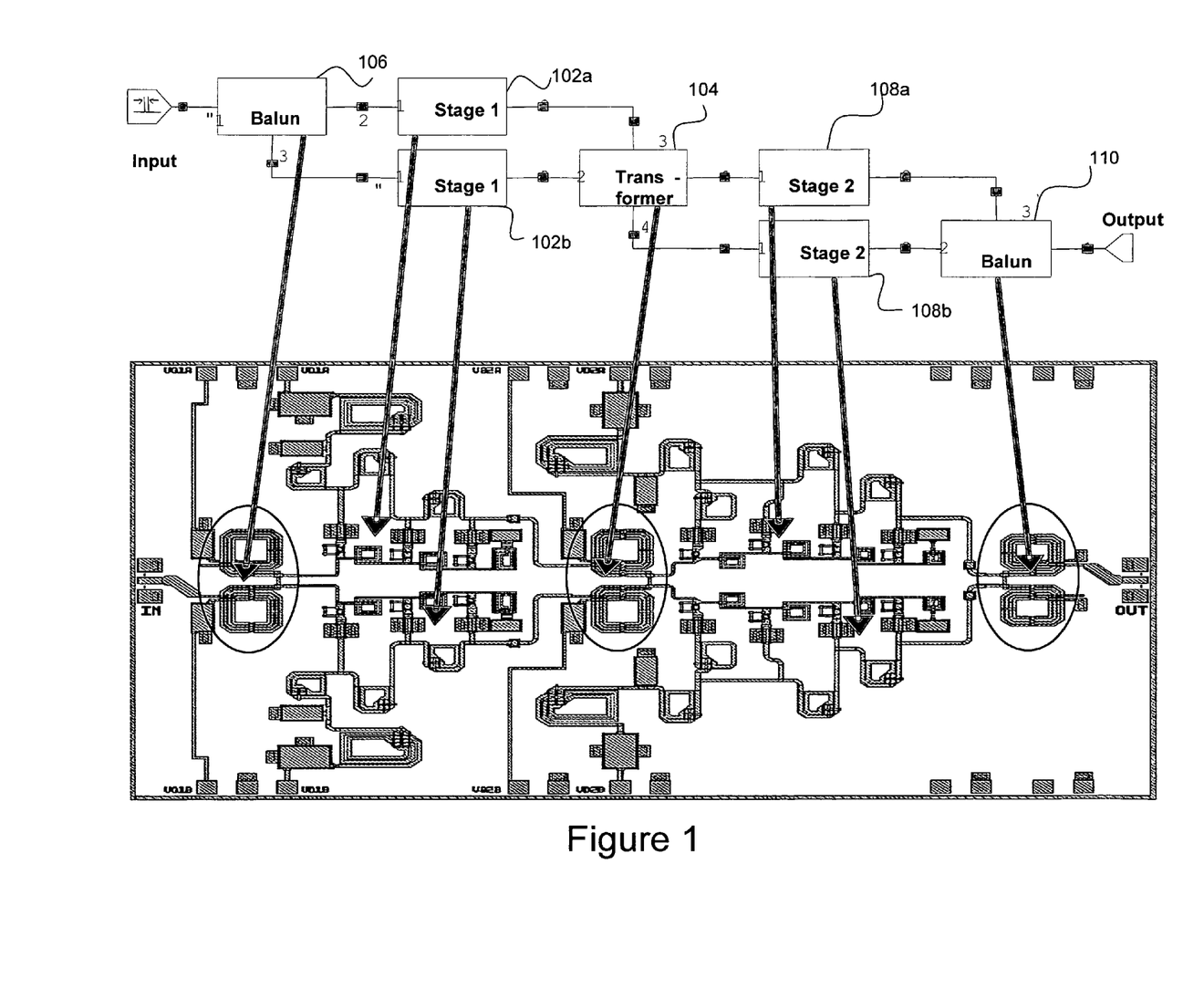
FIG. 1 is a functional block diagram and physical layout of a two-stage differential amplifier formed from single-ended amplifiers and a four-port transformer according to one embodiment of the present invention.

FIG. 1 is functional block diagram and physical layout of a two-stage differential amplifier 100 including first and second stages formed from single-ended amplifiers 102a,102b and 108a, 108b, respectively, interconnected through a four-port transformer 104 according to one embodiment of the present invention. In the figure the functional blocks are shown in the top portion of the figure with lines extending from each functional block to a corresponding portion on the physical layout of the amplifier shown in the bottom portion of the figure. In operation, output signals from the single-ended amplifiers 102a and 102b in the first stage are supplied to the transformer 104, which provides good suppression of second order intermodulation distortion signals present on the output signals of the single-ended amplifiers. The transformer 104, in turn, provides corresponding differential signals to the single-ended amplifiers 108a and 108b, as will be described in more detail below.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

The differential amplifier 100 further includes an input balun 106 that receives an input signal INPUT on a first unbalanced input port labeled 1 in FIG. 1 and provides output signals on two balanced output ports labeled 2 and 3. The balun 106 functions to convert the input unbalanced signal to a differential signal, as well as a matching network and performs an impedance transformation between signals on the input and output ports. The first balanced output port of the balun 106 is connected to the input of the single-ended amplifier 102a and the second balanced output port is connected to the input of the single-ended amplifier 102b. The amplifiers 102a and 102b amplify signals on the balanced output ports of the balun 106 and provide respective amplified output signals to first and second input ports of the four-port transformer 104.

In response to the amplified output signals from the amplifiers 102a and 102b, the transformer 104 outputs respective signals to a second pair of single-ended amplifiers 108a and 108b. The amplifiers 108a and 108b amplify the signals from the transformer 104 and provide respective amplified output signals to balanced input ports of an output balun 110. The balun 110 similarly converts the differential output signal to an unbalanced output signal OUTPUT, while functioning as a matching network and providing the unbalanced output signal on an output port responsive to the amplified output signals at the balanced input ports, with the unbalanced output signal corresponding to the output of the amplifier 100.

In operation, the four-port transformer 104 has proper amplitude and 180 degree phase relationships among the ports such that at the input ports of the transformer the desired amplified signals from the amplifiers 102a and 102b generate signals on the output ports that are 180 degrees out of phase. In contrast, unwanted or spurious signals, such as second order intermodulation distortion signals, are approximately in phase at the output ports of the transformer 104. Since the intermodulation distortion signals are in phase on both output ports of the transformer 104, ideally no current flows in the transformer 104 responsive to these signals. In this way, the transformer 104 effectively suppresses or eliminates these signals to thereby provide a high level of common mode rejection of the second order intermodulation distortion signals. Note the transformer 104 is tuned to the center frequency of the amplifier 100 and there may be some degradation in performance as the input signal moves away from the center frequency. Note that in the amplifier 100, although the input signal INPUT is a single ended signal, this signal is split into a differential signal and supplied to the transformer 104 to provide a high common mode rejection for intermodulation distortion signals.

Various topologies may be utilized for the 4-port transformer. In general the voltage, current, or wave impinging on either input port must result in approximately equal amplitude and opposite phase voltages, currents, or waves at the corresponding pair of output ports, including conventional center tapped transformers or more complicated electromagnetically coupled structures. The physical implementation is generally symmetric, but is not required to be so if the proper electrical relationships are maintained at the ports. In the embodiment in FIG. 1, the transformer 104 is comprised of a pair of planar spiral coupled transmission lines, interconnected as a pair of simple coupled line baluns. The resulting configuration resembles a four port version of a compensated balun.

Various topologies may be utilized for the single-ended amplifiers 102a, 102b and 108a and 108b, including distributed, reactive match, feedback, lossy match, and 90 degree balanced. In the embodiment illustrated in FIG. 1, each of the amplifiers 102a and 102b is a three transistor distributed amplifier while each of the amplifiers 108a and 108b is a four transistor distributed amplifier. In other embodiments, the amplifiers 102 and 108 have different topologies such as a single transistor with resistive feedback for gain and impedance matching.

Figure 2A:
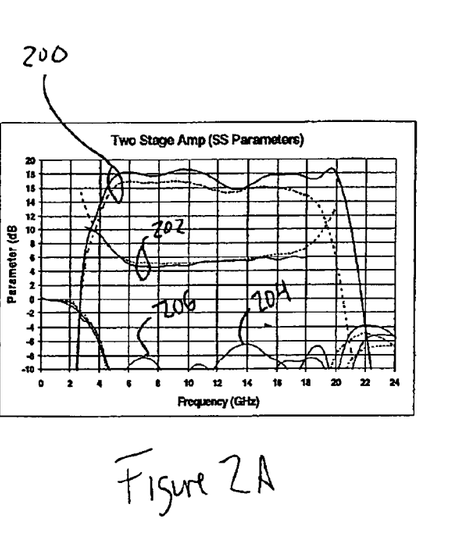
FIGS. 2A and 2B are graphs illustrating the measured and modeled performance of the differential amplifier of FIG. 1.
Figure 2B:
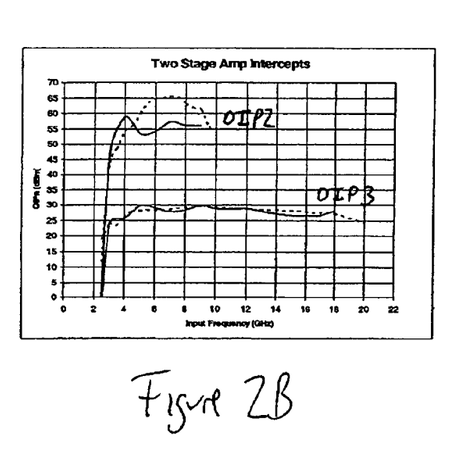

FIGS. 2A and 2B are graphs illustrating various measured and modeled parameters for the differential amplifier 100 of FIG. 1. The solid lines illustrate the measured parameters and the dotted lines modeled parameters. FIG. 2A shows gain 200, noise FIG. 202, input match 204, and output match 206 over a frequency range of 0-24 GHz. FIG. 2B illustrates second order output intercept power OIP2 and third order intercept power OIP3 for the amplifier 100 over the 0-22 GHz frequency range for the input signal INPUT.

Figure 3:
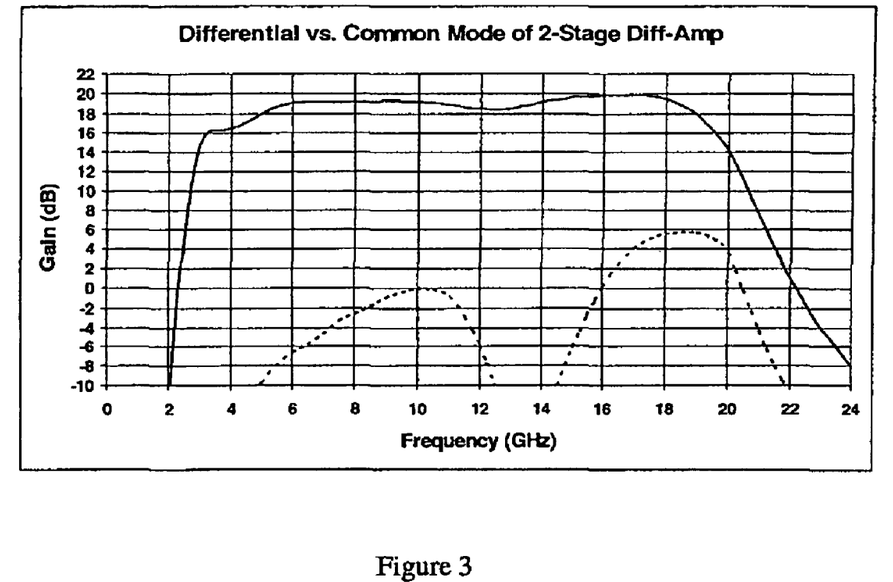
FIG. 3 is a graph illustrating the common mode rejection of the differential amplifier of FIG. 1.

FIG. 3 is a graph illustrating the common mode rejection of the differential amplifier 100 of FIG. 1. The solid line illustrates the gain of the amplifier 100 for differential driving signals and the dotted line illustrate the gain for common mode driving signals. As seen from this graph, the worst case common mode rejection is about 19 dB at 10 GHz and 12 dB at 18 GHz.

Figure 4:
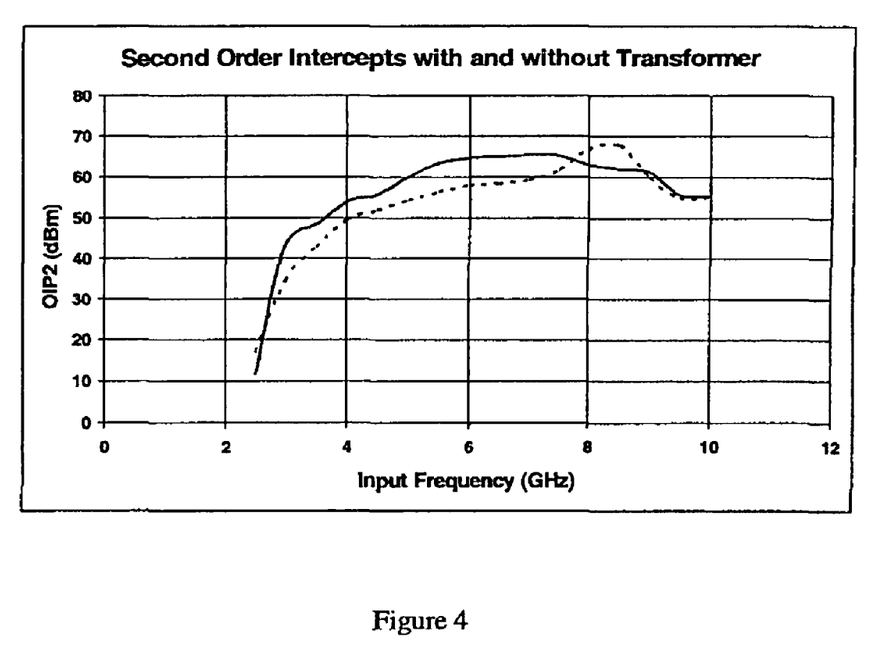
FIG. 4 is a graph illustrating the second order output intercept power of the differential amplifier of FIG. 1 with and without the four-port transformer.

FIG. 4 is a graph illustrating the second order output intercept power of the differential amplifier 100 of FIG. 1 with and without the four-port transformer 104. The solid line shows the second order output intercept power OIP2 with the transformer 104 and the dotted line shows OIP2 without the transformer. As seen from the figure, the presence of the transformer improves OIP2 by about 7 dB over the illustrated input frequency range of 2-10 GHz.

Figure 5A:
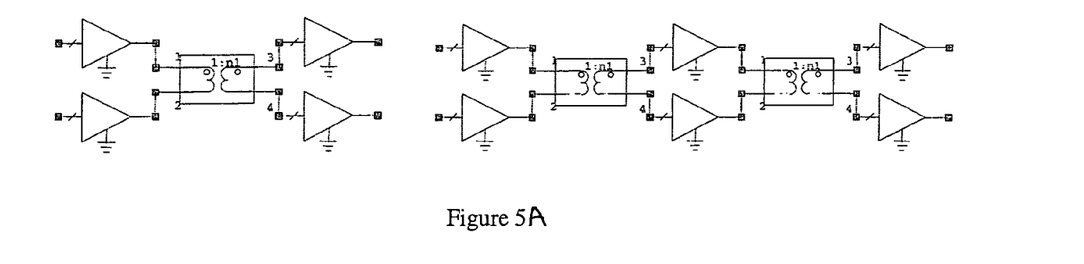
FIG. 5A is a block diagram illustrating a two-stage and a three-stage differential amplifier including one and two, respectively, four-port transformers according to embodiments of the present invention.

FIG. 5A is a block diagram illustrating a two-stage and a three-stage differential amplifier including one and two, respectively, four-port transformers 104 according to embodiments of the present invention. Multiple stages of single-ended amplifiers and four-port transformers can be cascaded to improve differential characteristics and increase gain. Assume individual stages have a gain of 10 dB and the four-port transformers are lossless with a 20 dB differential common mode rejection. In this situation, increasing from two stages and one transformer as in the amplifier 100 of FIG. 1 to three stages and 2 transformers increases gain from 20 db to 30 db and the common mode rejection from 20 dB to 40 dB.

Figure 5B:
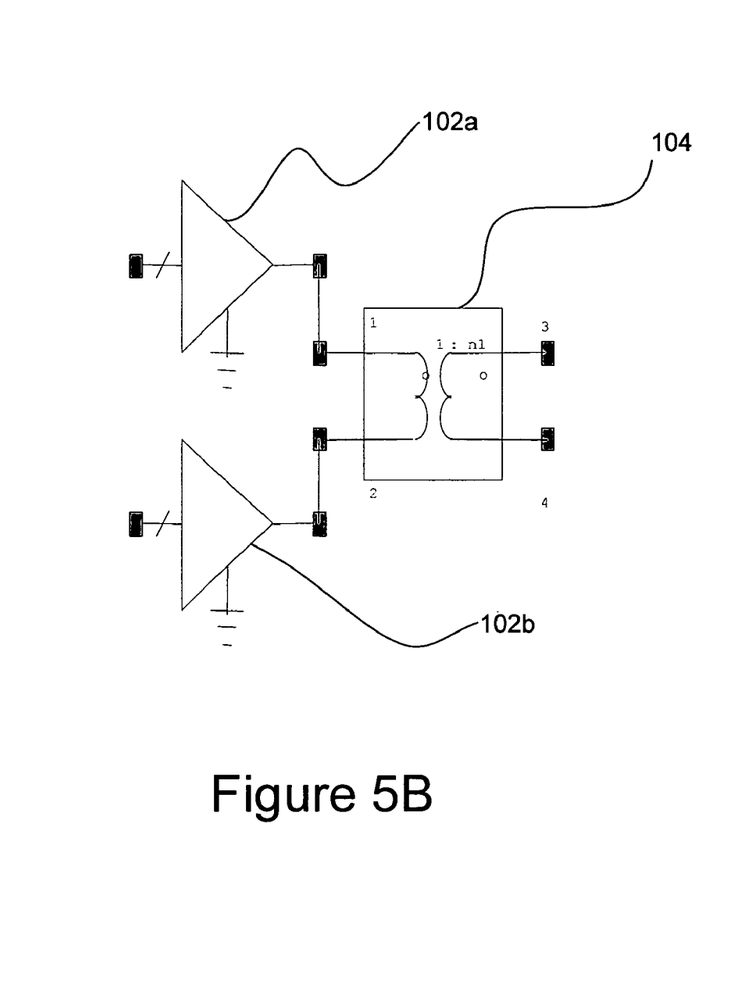
FIGS. 5B and 5C illustrate differential amplifiers according to embodiments of the present invention.
Figure 5C:
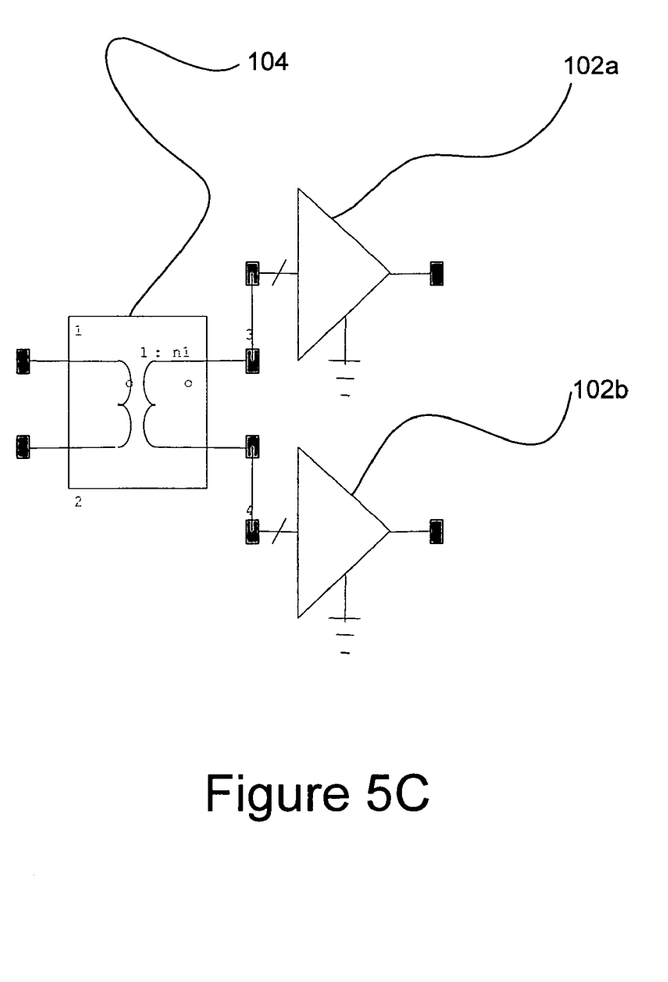

In other embodiments, signals from the balun 106 (FIG. 1) could be first input to the transformer 104 and then the outputs of the transformer provided to the inputs of two single-ended amplifiers 102a and 102b. FIG. 5B illustrates interconnection of the first stage of single-ended amplifiers 102a and 102b and the four-port transformer 104 according to the embodiment of FIG. 1 as previously described. FIG. 5C illustrates interconnection of the first stage of single-ended amplifiers 102a and 102b to the four-port transformer 104 according to another embodiment of the present invention. In this embodiment, the components 102 and 104 are reversed, with the outputs of the transformer being applied to the inputs of the single-ended amplifiers. This could be done in the embodiments of FIG. 5A as well. Applications of the differential amplifier 100 and differential amplifiers according to other embodiments of the present invention include wideband amplifiers as previously discussed as well as filters and line drivers. One skilled in the art will appreciate that since amplifiers having the topologies described herein according to embodiments of the invention provide common mode suppression of even order intermodulation distortion signals via the four-port transformer, then efforts can be focused on designing the single-ended amplifiers to provide good suppression of odd order intermodulation distortion signals. Finally, differential amplifiers according to embodiments of the present invention may operate at not only microwave frequencies, but also at lower and higher frequencies as well.

Figure 6:
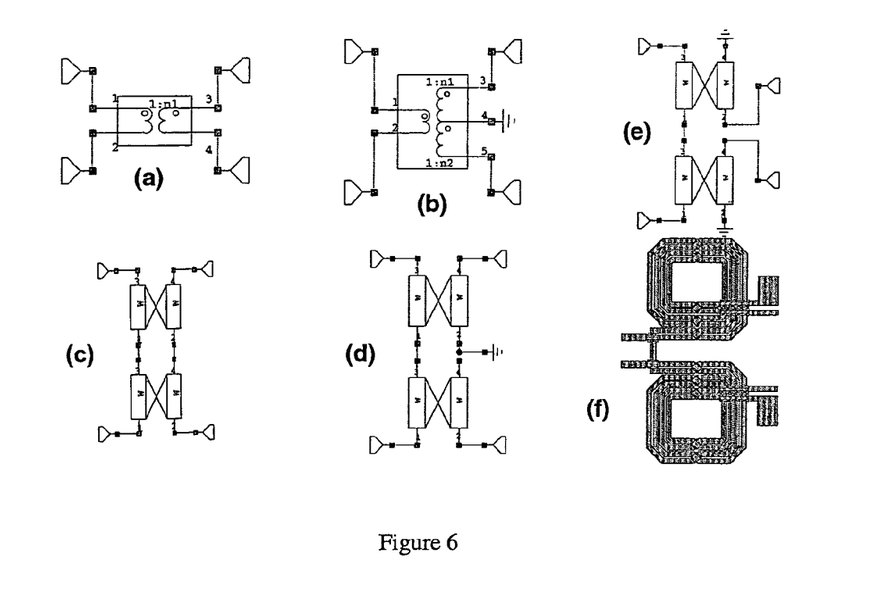
FIGS. 6a-6f are schematic diagrams of several sample embodiments of the four-port transformer of FIG. 1.

FIGS. 6a-6f are schematic diagrams of several sample embodiments of the four-port transformer 104 of FIG. 1. FIG. 6a depicts a four terminal transformer, FIG. 6b a center tapped transformer, FIG. 6c a transformer formed through single coupled lines, FIG. 6d a center tapped transformer, and FIGS. 6e and 6f compensated transformers. The input and output port pairs can also be interchanged for any of these configurations (i.e., be flipped or mirrored).

Figure 7:
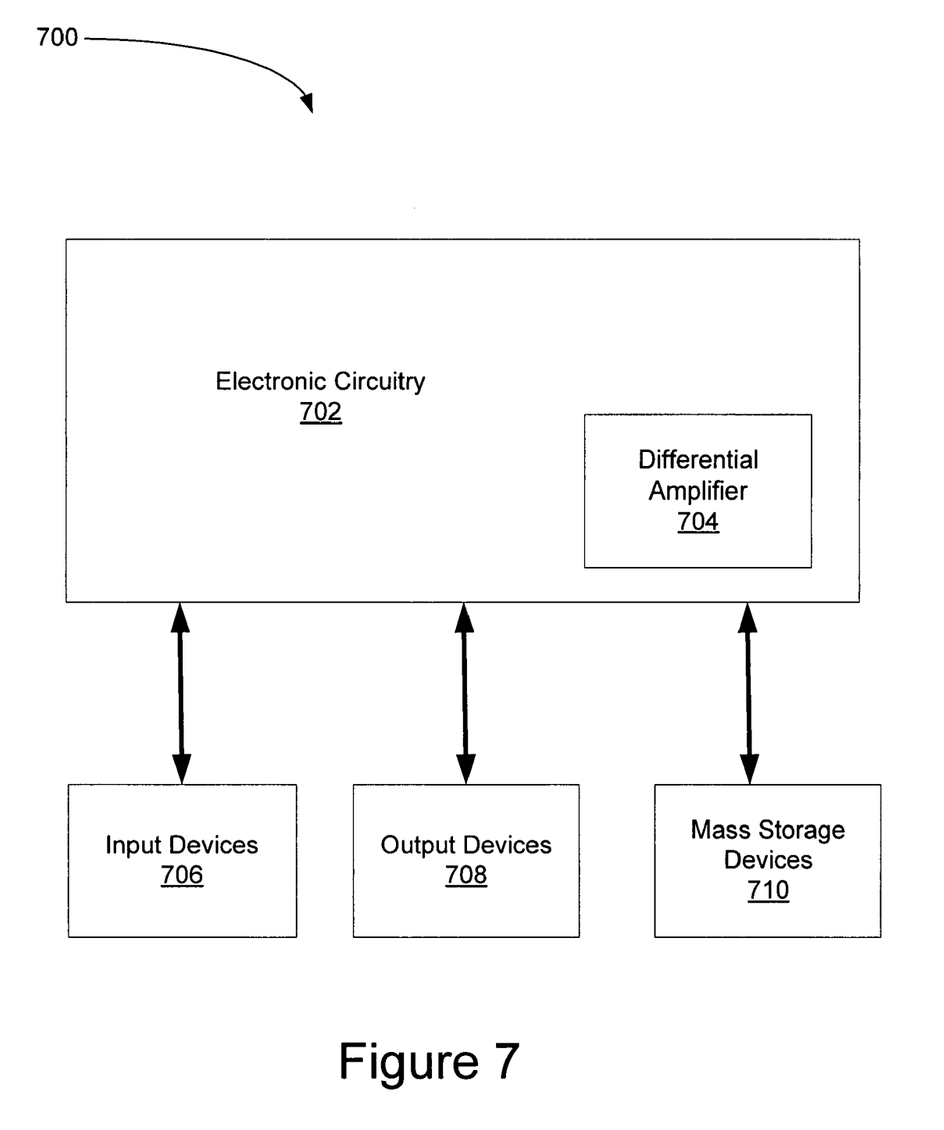
FIG. 7 is a block diagram of an electronic device, such as a cellular telephone, that includes electronic circuitry containing a differential amplifier, such as the amplifier of FIG. 1 or any of the other embodiments of differential amplifiers described herein, according to another embodiment of the present invention.

FIG. 7 is a block diagram of an electronic device 700, such as a cellular telephone, including electronic circuitry 702 containing a differential amplifier 704 according to one embodiment of the present invention. The amplifier 704 may correspond to the amplifier 100 of FIG. 1 or to any of the other embodiments of differential amplifiers described herein. The electronic circuitry performs various functions as required for the system 700, with the differential amplifier 704 amplifying associated signals as part of the operation of the electronic circuitry. The signal amplification could be either at very low levels, as a low noise amplifier, or at very high levels, as a power amplifier. This electronic circuitry may also comprise digital functionality where amplification of complementary high speed digital signals is required, such as input or output buffering and clock distribution. In addition, the electronic device 700 may include one or more input devices 706, such as a keypad, coupled to the electronic circuitry 702 to allow an operator to interface with the device. Typically, the electronic device 700 also includes one or more output devices 708 coupled to the electronic circuitry 702, such as a video display like and LCD screen. One or more data storage devices 710 are also typically coupled to the electronic circuitry 702 to store data or retrieve data from external storage media such as FLASH memory.

Even though various embodiments and advantages of the present invention have been set forth in the foregoing description, the above disclosure is illustrative only, and changes may be made in detail and yet remain within the broad principles of the present invention. Moreover, the functions performed by components in the differential amplifier may be combined to be performed by fewer elements or separated and performed by more elements in other embodiments of the present invention, as will be appreciated by those skilled in the art. Therefore, the present invention is to be limited only by the appended claims.

What is claimed is:

1. A differential amplifier, comprising:
   a first single-ended amplifier circuit;
   a second single-ended amplifier circuit; and
   a four-port transformer circuit having two input ports and two output ports, the two input ports being coupled to the first and second single-ended amplifier circuits, respectively, to form the differential amplifier, and the four-port transformer circuit operable to suppress even order intermodulation distortion signals on signals provided on the output ports.

2. The differential amplifier of claim 1,
   wherein the transformer includes first and second input ports and third and fourth output ports;
   wherein each of the single-ended amplifier circuits includes an input port and an output port;
   wherein the output port of the first single-ended amplifier circuit is coupled to the first input port of the transformer; and
   wherein the output port of the second single-ended amplifier circuit is coupled to the second input port of the transformer.

3. The differential amplifier of claim 1,
   wherein the transformer includes first and second input ports and third and fourth output ports;
   wherein each of the single-ended amplifier circuits includes an input port and an output port;
   wherein the third output port of the transformer is coupled to the input port of the first single-ended amplifier circuit; and
   wherein the fourth output port of the transformer is coupled to the input port of the second single-ended amplifier circuit.

4. The differential amplifier of claim 1 wherein the amplifier operates on signals in the microwave frequency range.

5. The differential amplifier of claim 1 wherein each of the single-ended amplifier circuits has a distributed amplifier topology.

6. The differential amplifier of claim 1 wherein each of the single-ended amplifier circuits has a reactive match topology.

7. The differential amplifier of claim 1 wherein each of the single-ended amplifier circuits has a feedback topology.

8. The differential amplifier of claim 1 wherein each of the single-ended amplifier circuits has a lossy match topology.

9. The differential amplifier of claim 1 wherein each of the single-ended amplifier circuits has a 90 degree balanced topology.

10. The differential amplifier of claim 1 wherein the four-port transformer comprises a center tapped transformer.

11. The differential amplifier of claim 1 wherein the four-port transformer includes single coupled lines.

12. The differential amplifier of claim 1 wherein the four-port transformer comprises a compensated transformer.

13. A differential amplifier, comprising:
   a first single-ended amplifier circuit;
   a second single-ended amplifier circuit;
   a four-port transformer circuit coupled to the first and second single-ended amplifier circuits to form the differential amplifier, the four-port transformer circuit operable to suppress even order intermodulation distortion on signals provided on output ports of the four-port transformer circuit; and
   wherein the first single-ended amplifier circuit and second single-ended amplifier circuit comprise a first stage of the amplifier, and wherein the amplifier further comprises additional stages coupled in series with the first stage, with four-port transformers circuits being connected between stages.

14. The differential amplifier of claim 13 wherein the amplifier includes one or more additional stages.

15. An electronic system, comprising:
   electronic circuitry coupled to input, output, and storage devices, the electronic circuitry including a differential amplifier, the differential amplifier including,
   a first single-ended amplifier circuit;
   a second single-ended amplifier circuit;
   a four-port transformer circuit coupled to the first and second single-ended amplifier circuits to form the differential amplifier, the four-port transformer circuit operable to suppress even order intermodulation distortion.

16. The electronic system of claim 15 wherein the electronic circuitry comprises cellular telephone circuitry.

17. The electronic system of claim 15 wherein the electronic circuitry comprises digital circuitry and wherein the differential amplifier functions to amplify complementary digital signals as part of input or output buffering circuitry or clock distribution circuitry.

18. A method of differentially amplifying signals, the method comprising:

applying differential signals to a four-port transformer;

suppressing even order intermodulation distortion signals on the differential signals; and amplifying the signals from the transformer.

19. The method of claim 18 wherein the frequency of the signals is higher than the microwave frequency range.

20. The method of claim 19 wherein the frequency of the signals is lower than the microwave frequency range.

* * * * *

UNITED STATES PATENT AND TRADEMARK OFFICE
CERTIFICATE OF CORRECTION

PATENT NO. : 7,592,866 B2
APPLICATION NO. : 11/708992
DATED : September 22, 2009
INVENTOR(S) : David E. Meharry

It is certified that error appears in the above-identified patent and that said Letters Patent is hereby corrected as shown below:

- Title Page, item (54) on the first page of the Letters Patent, the word "WIDEBRAND" in the title of the patent should read --WIDEBAND--.

- In Column 1 immediately preceding the priority claim, the word "WIDEBRAND" in the title of the patent should read --WIDEBAND--.

Signed and Sealed this

First Day of December, 2009

David J. Kappos
*Director of the United States Patent and Trademark Office*